United States Patent [19]

Shaffer et al.

[11] Patent Number: 4,980,578
[45] Date of Patent: Dec. 25, 1990

[54] FAST SENSE AMPLIFIER

[75] Inventors: David S. Shaffer, Dallas; Kevin M. Ovens, Garland, both of Tex.

[73] Assignee: Texas Instruments Incorporated, Dallas, Tex.

[21] Appl. No.: 541,188

[22] Filed: Jun. 20, 1990

Related U.S. Application Data

[63] Continuation of Ser. No. 287,191, Dec. 20, 1988, abandoned.

[51] Int. Cl.$^5$ ............................................. H03K 17/60
[52] U.S. Cl. .................................... 307/300; 307/446; 307/530; 307/570
[58] Field of Search ................ 307/280, 300, 446, 458, 307/499, 530, 544, 546, 547, 548, 549, 570

[56] References Cited

U.S. PATENT DOCUMENTS

| | | | |
|---|---|---|---|
| 4,144,590 | 3/1979 | Kitagawa et al. | 365/205 |
| 4,333,047 | 6/1982 | Flink | 323/311 |
| 4,356,416 | 10/1982 | Weischedel | 307/570 |
| 4,590,395 | 5/1986 | O'Conner et al. | 307/570 |
| 4,616,146 | 10/1986 | Lee et al. | 307/446 |
| 4,636,665 | 1/1987 | McLaughlin | 307/530 |
| 4,638,186 | 1/1987 | McLaughlin | 307/446 |
| 4,694,203 | 9/1987 | Uragami et al. | 307/446 |
| 4,746,817 | 5/1988 | Banker et al. | 307/446 |
| 4,760,293 | 7/1988 | Hebenstreit | 307/570 |
| 4,779,014 | 10/1988 | Masuoka et al. | 307/446 |
| 4,804,869 | 2/1989 | Masuda et al. | 307/446 |
| 4,808,850 | 2/1989 | Masuda et al. | 307/446 |
| 4,813,020 | 3/1989 | Iwamura et al. | 365/189 |
| 4,829,201 | 5/1989 | Masuda et al. | 307/446 |

FOREIGN PATENT DOCUMENTS 0145004  6/1985  European Pat. Off. ............ 307/446

OTHER PUBLICATIONS

David Benima, Transistor Saturation Control, Mar. 1964, RCA Technical Notes.

Primary Examiner—Stanley D. Miller
Assistant Examiner—T. Cunningham
Attorney, Agent, or Firm—B. Peter Barndt; Melvin Sharp; N. Rhys Merrett

[57] ABSTRACT

A sense amplifier 10 for a memory or logic array has a bipolar device transistor 11 that is kept from saturating by one or more unipolar transistors (12, 13) coupled between the collector (18) and base (17) of the bipolar transistor 11.

3 Claims, 1 Drawing Sheet

FAST SENSE AMPLIFIER

This application is a continuation, of application Ser. No. 287,191, filed 12/20/88, and now abandoned.

FIELD

This invention relates in general to sense amplifiers, and, in particular, to sense amplifiers for programmable logic arrays that are erasable or electrically programmable.

BACKGROUND

Memory devices and logic arrays have matrices of cells. In memory arrays the cells hold data; in logic arrays the cells include elements for AND and OR cells. In either array, the cells provide an output to an output line. The output line is connected to a sense amplifier. The magnitude of the signal placed on the output line is low. The output signal has to be sensed and amplified before it can be used to drive an output circuit, such as a display, or before it is put on a bus for transmission to another device.

Memory and logic arrays are normally constructed with either a unipolar (MOS) or bipolar process. Recently such arrays have been constructed with a BIMOS or BICMOS process. In order to increase the speed of such arrays, others have used processes that include steps for fabricating Schottky diodes and Schottky transistors. A well known advantage of such transistors is their property for preventing a bipolar logic transistor from entering saturation. Saturation will slow the switching speed of such transistors.

Certain processes are not compatible with the formation of Schottky devices. In particular, a BICMOS process developed and used by Texas Instruments, Inc., the assignee of this patent, is not compatible with Schottky device formation. Rather than alter the process, it would be desirable to have another solution for obtaining the beneficial effects of non-saturating bipolar transistor without the use of Schottky devices. Such a solution would be especially useful in a memory or logic array that uses bipolar transistor as sense amplifiers to read the output of an array.

SUMMARY

The invention provides a sense amplifier having a bipolar transistor and a saturation control circuit. The saturation control circuit comprises at least one unipolar transistor coupled across the collector-base junction of the bipolar transistor. The voltage drop across the unipolar transistor is sufficient to keep the bipolar transistor out of saturation. Better control of the collector base voltage is provided by a pair of unipolar transistors that are fabricated to provide the desired voltage drop. The size of the two transistors are proportioned to provide a net collector-base voltage drop that is less than the saturating voltage. Stated another way, the single unipolar transistor or the pair of transistors are sized to control the base and collector currents so that the collector current is less than a saturating current.

In the preferred embodiment the unipolar transistors are of different size in order to provide different voltage drops across each device during their critical operation. The two unipolar transistors are connected together to provide a predetermined, non-saturating voltage drop across the collector-base junction of the bipolar transistor. One of the two unipolar transistors has its source connected to the collector; the other has its source connected to the base. The two drains are common; the two gates are common.

The saturation control circuit is a current divider. When the bipolar transistor is in its forward active stat ("on") the base current is amplified by $\beta$. A current source is connected to the common drains. When the bipolar transistor is on, only a small fraction, e.g.

$$\frac{1}{1+\beta},$$

will pass into the base; the remainder will feed the collector. As such, the operating voltages of the two unipolar transistor will be different. The two unipolar transistors are sized so the difference between their respective operating voltages will be sufficient to keep the collector-base junction of the bipolar transistor from turning on and driving the transistor into saturation.

DETAILED DESCRIPTION

Figure 1:
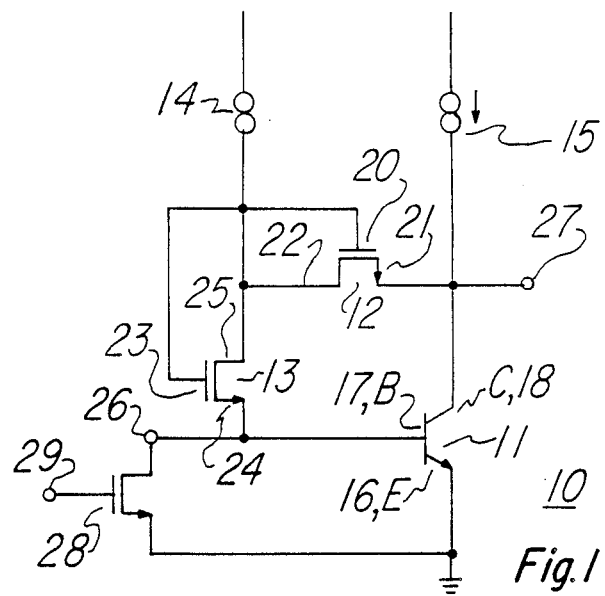
FIG. 1 is a schematic of the preferred embodiment of the invention.

With reference to FIG. 1 there is shown a sense amplifier 10. An NPN transistor 11 has a base 17 with an input terminal 26 for receiving an input signal. Typically the signal is either a low or high impedance. For example, a field effect transistor 28, in particular and n-channel MOS transistor has low impedance when it is on and a high impedance when it is off. A low voltage applied to gate 29 will turn transistor 28 off and create a high impedance path to ground through transistor 28. An output node 27 is coupled to the collector 18 and the emitter is connected to a reference voltage, e.g. ground.

Current source 14 provides current to base 17 through unipolar transistor 13. Current source 15 supplies the collector when transistor 11 is on. A first MOS transistor has its source 21 connected to the collector 18 and the output 27. A second MOS transistor 13 has its source 24 connected to the base 17 of the NPN transistor 11. The gate 20 of the first MOS transistor 12 is connected to its drain 22; the gate 23 of the second MOS transistor 13 is connected to its drain 25. The current source 14 is connected to the drains 22, 25.

The sense amplifier is switched on or off by changing the impedance at node 26. If the impedance is low, the base emitter junction of transistor 11 will be off, the transistor 11 will not conduct, and the voltage at node 27 will rise to a high logic level. When the impedance is higher, the voltage at the input 26 rises to a high level (at least $1V_{BE}$), the base-emitter junction of 11 is forward biased, the transistor 11 conducts and the output 27 falls to the reference or ground voltage. Unless restrained, once in its conducting state, transistor 11 will increasingly conduct current until it saturates.

In operation, when gate node 29 has a high voltage, transistor 28 is on. Current source 14 keeps transistor 13 on. All of the current through transistor 13 is conducted to ground through transistor 28. Since the base 17 and emitter 16 are at the same (ground) potential, bipolar transistor 11 is off and the output node 18 rises to a high level. The high level at output node 18 keeps transistor 12 off.

When a low (ground) voltage is applied to node 29, transistor 28 is turned off, thereby allowing the voltage at base contact 26 to rise until bipolar transistor 11 is turned on. When transistor 11 is on, the voltage at node 18 will fall to a low logic level or reference voltage, i.e. ground. Once transistor 11 is on, the current from source 14 will split in accordance with the gain ($\beta$) of transistor 11, forcing most of the current from source 14 through transistor 12 to join with the current from source 15.

For example, if the gain ($\beta$) of transistor 11 is 99, then the base current will be $1/1 + \beta$ of the total transistor current, i.e. 1/100 of the emitter current. So, if current source 14 is 1 ma. and source 15 is 2 ma., when transistor 11 is on the base current will be $$\frac{3 \text{ ma.}}{1 + 99}$$

or 0.03 ma. Since source 15 is 2 ma. the current carried by transistor 12 is 0.97 ma.

Figure 2:
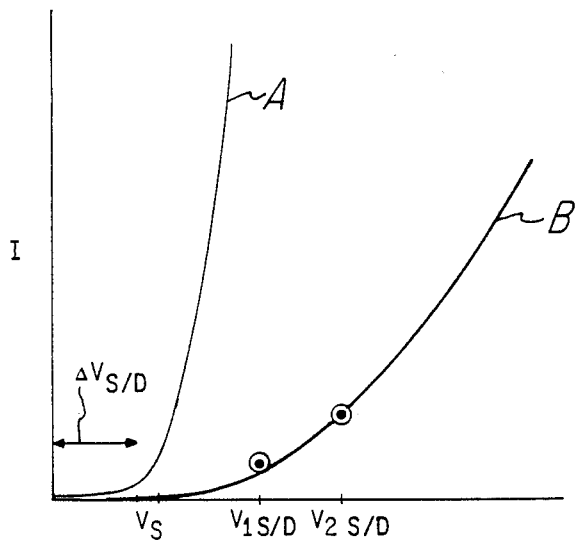
FIG. 2 is a current v. voltage diagram showing in curve A the collector v. collector-base voltage of the bipolar transistor and in curve B the channel current v. source/drain voltage of the unipolar transistors.

MOS transistors 12, 13 prevent saturation of transistor 11. With reference to FIG. 2, curve A shows the collector current as a function of the collector-base voltage. Once the voltage drop across the base-collector junction exceeds a characteristic voltage, Vs, the current in the collector rapidly increases and the transistor 11 saturates. If the voltage drop across the base-collector junction is kept below $V_s$, the transistor 11 will remain in its forward active state. The latter is desirable because it takes longer for a transistor to switch from its saturated state to its off state than it does for it to switch from forward active to off.

In will be recalled that when transistor 11 is on, the current carried by transistor 13 (the base current) is substantially less than the current carried by transistor 12. Transistor 12 directs most of the current from source 14 to the collector 18. So, the $V_{D/S}$ of transistor 13 will be close to the transition point where curve B rises off the voltage abscissa. The $V_{D/S}$ of transistor 12 will be selected high enough on curve B so the current carried by transistor 12 meets the gain requirements of transistor 11 but low enough so the difference between $V_{D/S}$ of transistors 13 and 12 is less than the saturating voltage, $V_S$, of the base-collector junction.

Curve B shows the drain current v. drain-source voltage for the MOS transistors 12, 13. When transistor 11 is on, current will flow in the two MOS transistors 12, 13. The current density in each is dependent upon the size of the MOS transistor and the $\beta$ of transistor 11, i.e., the larger the transistor, the more current it will carry. The transistors are fabricated to have a difference between their source-drain voltages that is less than the saturation voltage, $V_s$, of transistor 11. For example, if the saturation voltage is 0.7 v, then the first MOS transistor 12 is built to have a drain-source voltage of 1.2 v and the second 13 have a drain-source voltage of 0.8v. The voltage drop across the collector-base junction will be 0.4v (1.2 v $-$ 0.8 v) which is less than the 0.7 v saturation voltage $V_S$.

Those skilled in the art will recognize that only one unipolar transistor is needed to prevent the transistor 11 from saturating if the $V_{DS}$ is lower than $V_S$ at the operating $I_{DS}$. However, it has been found in the preferred embodiment that two MOS transistors differentially sized yield a greater control in maintaining a desired voltage differential across the collector-base junction. So, it is contemplated within the scope of this invention that a single unipolar transistor with source-drain voltage less than the saturating voltage of the transistor 11 would keep transistor 11 from saturating so long as the gate source voltage was lower than the saturating voltage, $V_S$, at the operating drain-source current. However, multiple unipolar devices can be more reliably fabricated and the voltage differences between such lager devices is likewise more reliable.

Those skilled in the art will also recognize that current sources 14,15 are readily constructed from a wide variety methods, such as voltage sources with fixed series resistors, a P-channel device, etc. Such sources are available in any integrated circuit. Likewise, other input circuits different from transistor 28 can be used with transistor 11.

Those skilled in the art will recognize further equivalent structures and features that come within the spirit and scope of the following claims. Included in such equivalent structures and features are the substitution of junction or other unipolar transistors for the MOS transistors shown above and the use of PNP bipolar transistors with NMOS devices. These and other modifications and substitutions can be made without departing from the spirit and scope of the claims.

What we claim is:

1. A sense amplifier comprising:
   a bipolar transistor having a base, emitter and collector;
   an input coupled to the base;
   an output coupled to the collector;
   a reference voltage coupled to the emitter:
   a saturation control circuit including first and second unipolar transistors, each having a source, gate and drain, the first unipolar transistor with its source connected to the collector and the second unipolar transistor with its source connected to the base, and the gates and drains of the unipolar transistors all connected together to the output of a first current source;
   wherein the output of the first current source divides between the first and second unipolar transistors to make the voltage drop from drain to source of the first unipolar transistor minus the voltage drop from drain to source of the second unipolar transistor less that the base-collector saturation voltage of the bipolar transistor when the bipolar transistor is on.

2. The sense amplifier of claim 1 wherein the unipolar transistors have different width-to-length ratios.

3. The sense amplifier of claim 1 having a second current source connected to the collector.

* * * * *

UNITED STATES PATENT AND TRADEMARK OFFICE
CERTIFICATE OF CORRECTION

PATENT NO. : 4,980,578

DATED : 12/25/90

INVENTOR(S) : DAVID S. SHAFFER AND KEVIN M. OVENS

It is certified that error appears in the above-identified patent and that said Letters Patent is hereby corrected as shown below:

In Claim 1, column 4, line 55, delete "that" and insert --than--.

Signed and Sealed this

Twenty-sixth Day of July, 1994

Attest:

BRUCE LEHMAN

*Attesting Officer*   *Commissioner of Patents and Trademarks*